US008013630B2

(12) United States Patent
Ito

(10) Patent No.: US 8,013,630 B2
(45) Date of Patent: Sep. 6, 2011

(54) TERNARY VALVE INPUT CIRCUIT

(75) Inventor: Hideo Ito, Tatebayashi (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 12/484,670

(22) Filed: Jun. 15, 2009

(65) Prior Publication Data

US 2009/0309630 A1 Dec. 17, 2009

(30) Foreign Application Priority Data

Jun. 13, 2008 (JP) ................................. 2008-154833

(51) Int. Cl.
*H03K 19/00* (2006.01)
*H03K 19/02* (2006.01)

(52) U.S. Cl. ................ 326/60; 326/59; 326/58; 326/57; 326/56

(58) Field of Classification Search ............... 326/56–60
See application file for complete search history.

(56) References Cited

U.S. PATENT DOCUMENTS

| | | | | |
|---|---|---|---|---|
| 4,990,796 A | * | 2/1991 | Olson | 327/185 |
| 5,153,457 A | * | 10/1992 | Martin et al. | 326/84 |
| 5,479,114 A | * | 12/1995 | Miura | 326/60 |
| 5,498,980 A | * | 3/1996 | Bowles | 326/60 |
| 5,610,537 A | * | 3/1997 | Hastings | 326/59 |
| 5,969,540 A | * | 10/1999 | Hwang | 326/56 |
| 6,133,753 A | * | 10/2000 | Thomson et al. | 326/56 |
| 6,211,698 B1 | * | 4/2001 | Suh | 326/60 |
| 7,053,655 B2 | * | 5/2006 | Brox | 326/60 |
| 7,088,139 B1 | * | 8/2006 | Blom | 326/60 |
| 7,098,833 B2 | * | 8/2006 | Stulik et al. | 341/155 |
| 7,199,611 B2 | * | 4/2007 | Naffziger et al. | 326/59 |
| 7,373,569 B2 | * | 5/2008 | Klass | 714/726 |
| 7,541,836 B2 | * | 6/2009 | Whetsel | 326/59 |
| 7,567,628 B2 | * | 7/2009 | Darabi | 375/318 |
| 2001/0048321 A1 | * | 12/2001 | Culler | 326/60 |
| 2002/0021144 A1 | * | 2/2002 | Morgan et al. | 326/57 |
| 2002/0105356 A1 | * | 8/2002 | Genna et al. | 326/57 |
| 2003/0011400 A1 | * | 1/2003 | Lee et al. | 326/59 |
| 2005/0179462 A1 | * | 8/2005 | Whetsel | 326/59 |
| 2005/0270184 A1 | | 12/2005 | Stulik et al. | |
| 2007/0080715 A1 | * | 4/2007 | Whetsel | 326/59 |

FOREIGN PATENT DOCUMENTS

JP 2689871 B2 8/1997

OTHER PUBLICATIONS

Korean Office Action for Korean Application No. 10-2009-52486 mailed Jan. 12, 2011 with English translation.

\* cited by examiner

*Primary Examiner* — Rexford N Barnie
*Assistant Examiner* — Matthew C Tabler
(74) *Attorney, Agent, or Firm* — Cantor Colburn LLP

(57) ABSTRACT

A pull-up switching device for controlling connection and non-connection of an input terminal IN and a first supply VDD and a pull-down switching device for controlling connection and non-connection of the input terminal IN and a second supply VSS are provided. The pull-up switching device and the pull-down switching device are operated exclusively on and off in time division to hold and output the state of the input terminal during each operating state from the two output terminals.

6 Claims, 11 Drawing Sheets

US 8,013,630 B2

TERNARY VALVE INPUT CIRCUIT

CROSS-REFERENCE TO RELATED APPLICATIONS

The entire disclosure of Japanese Patent Application No. 2008-154833 including specifications, claims, drawings, and abstract is incorporated herein by references.

BACKGROUND OF THE INVENTION

1. Field of the Invention

The present invention relates to a ternary value input circuit for digitally realizing ternary value inputs.

2. Description of the Related Art

Ternary value input circuits are known for communicating input terminal states of high level, low level, and open as a level of an output terminal level.

For example, a ternary value input circuit disclosed in FIG. 11 is composed of a voltage divider circuit formed from resistors 10 and 12 connected to an input terminal IN and two inverter circuits 14 and 16 having different threshold voltages.

The first inverter circuit 14 is formed from a P-channel field-effect transistor 14a and an N-channel field-effect transistor 14b and the second inverter circuit 16 is formed from a P-channel field-effect transistor 16a and an N-channel field-effect transistor 16b. The inverter circuit 14 is connected between the input terminal IN and an output terminal OUT1. The inverter circuit 16 is connected between the input terminal IN and an output terminal OUT2.

A ternary value input circuit of the related art analogically detects the state of the input terminal IN in accordance with the transistor threshold voltages and varies the output states of the output terminals OUT1 and OUT2. This resulted in a problem of increased device area due to setting a desired threshold voltage at each transistor.

Furthermore, since it is necessary to complementarily connect each transistor, a problem also results where the operation of the ternary value input circuit becomes unstable when the threshold voltage fluctuates. In addition, there is also a problem of a complex design since it is necessary to take into consideration the fluctuation of the threshold voltage of each transistor.

SUMMARY OF THE INVENTION

One aspect of the present invention is a ternary value input circuit for converting and outputting a combination of states of two output terminals, comprising a pull-up switching device for controlling connection and non-connection of the input terminal and a first power supply, and a pull-down switching device for controlling connection and non-connection of the input terminal and a second power supply. The pull-up switching device and the pull-down switching device are operated exclusively on and off in time division to hold and output the state of the input terminal at each operating state from the two output terminals.

BRIEF DESCRIPTION OF THE DRAWINGS

Preferred embodiments of the present invention will be described in detail based on the following drawings, wherein.

DESCRIPTION OF PREFERRED EMBODIMENTS

Figure 1:
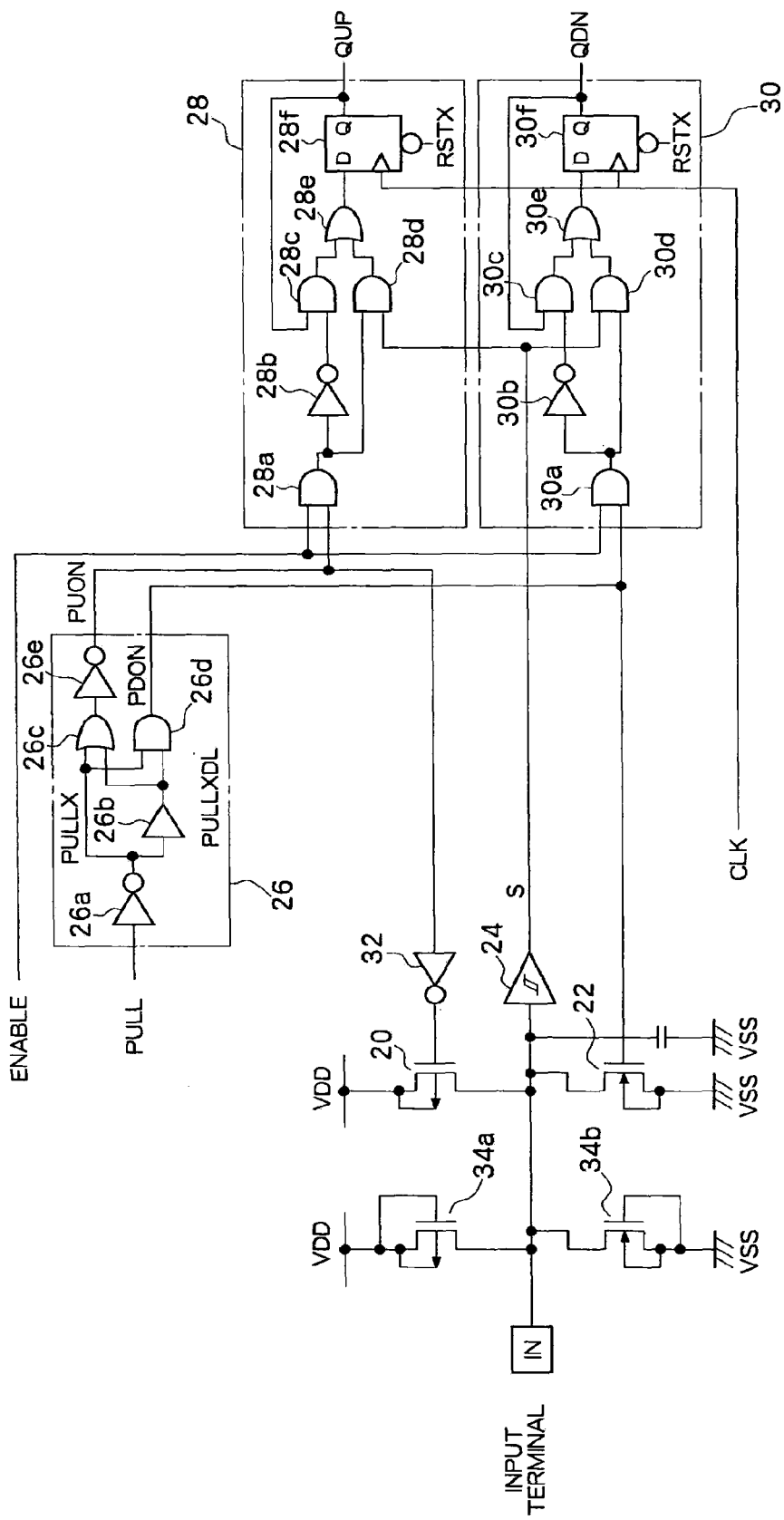
FIG. 1 shows a configuration of the ternary value input circuit in an embodiment of the present invention.

As shown in FIG. 1, a ternary value input circuit 100 in an embodiment of the present invention includes a pull-up transistor 20, a pull-down transistor 22, a Schmitt trigger buffer 24, a pull signal generator circuit 26, a pull-up output circuit 28, and a pull-down output circuit 30.

The pull-up transistor 20 can be configured from a P-channel field-effect transistor. The drain of the pull-up transistor 20 connects to a supply voltage VDD and the source connects to the input terminal IN. The gate of the pull-up transistor 20 connects to an output terminal of a NOT gate 32. The pull-down transistor 22 can be configured from an N-channel field-effect transistor. The drain of the pull-down transistor 22 connects to the input terminal IN and the source is grounded.

The Schmitt trigger buffer 24 converts an input value and outputs a pulse. More specifically, if the input voltage is lower than an upper threshold voltage, the output becomes a low level (L), and if the input voltage reaches the upper threshold voltage, the output changes to a high level (H). Even though the input voltage drops below the upper threshold voltage in this state, the high level (H) is maintained provided the input voltage is at a state higher than the lower threshold voltage. If the input voltage is lower than the lower threshold voltage, the output becomes a low level (L). At this time, the difference between the upper and lower limits of the threshold voltage is referred to as a hysteresis voltage and the larger the value the higher the noise resistance.

The pull signal generator circuit 26 includes a NOT gate 26a, a buffer 26b, an OR gate 26c, an AND gate 26d, and a NOT gate 26e. To the input terminal of the NOT gate 26a is input a pull signal PULL and the output terminal is connected to input terminals of the buffer 26b, OR gate 26c, and AND gate 26d. The output terminal of the buffer 26b is connected to the input terminals of the OR gate 26c and the AND gate 26d. The output terminal of the OR gate 26c is connected to the input terminal of the NOT gate 26e. The output of the NOT gate 26e is output as a pull-up signal PUON to the pull-up output circuit 28 and the NOT gate 32. The output of the AND gate 26d is output as a pull-down signal PDON to the pull-down output circuit 30 and the gate of the pull-down transistor 22.

The pull-up output circuit 28 includes an AND gate 28a, a NOT gate 28b, an AND gate 28c, an AND gate 28d, an OR gate 28e, and a flip-flop 28f. To the AND gate 28a are input an enable signal ENABLE and a pull-up signal PUON. The output terminal of the AND gate 28a is connected to the input terminal of the NOT gate 28b and an input terminal of the AND gate 28d. The output terminal of the NOT gate 28b is connected to an input terminal of the AND gate 28c. To an input terminal of the AND gate 28c is connected the output terminal of the flip-flop 28f. To an input terminal of the AND gate 28d is connected the output of the Schmitt trigger buffer 24. The output terminals of the AND gate 28c and the AND gate 28d are connected to the input terminals of the OR gate 28e and the output terminal of the OR gate 28e is connected to the input of the flip-flop 28f. To the clock terminal of the flip-flop 28f is input a system clock signal CLK. The output of the flip-flop 28f is a pull-up output signal. The pull-up output circuit 28 latches the state of the input terminal IN when the enable signal ENABLE and the pull-up signal PUON are high levels.

The pull-down output circuit 30 includes an AND gate 30a, a NOT gate 30b, an AND gate 30c, an AND gate 30d, an OR gate 30e, and a flip-flop 30f. To the AND gate 30a are input the enable signal ENABLE and the pull-down signal PDON. The output terminal of the AND gate 30a is connected to the input terminal of the NOT gate 30b and an input terminal of the AND gate 30d. The output terminal of the NOT gate 30b is connected to an input terminal of the AND gate 30c. An input terminal of the AND gate 30c is connected to the output terminal of the flip-flop 30f. An input terminal of the AND gate 30d is connected to the output terminal of the Schmitt trigger buffer 24. The output terminals of the AND gate 30c and the AND gate 30d are connected to the inputs of the OR gate 30e and the output terminal of the OR gate 30e is connected to the input terminal of the flip-flop 30f. To the clock terminal of the flip-flop 30f is input the system clock signal CLK. The output of the flip-flop 30f is the pull-down output signal. The pull-down output circuit 30 latches the state of the input terminal IN when the enable signal ENABLE and the pull-down signal PDON are high levels.

Figure 2:
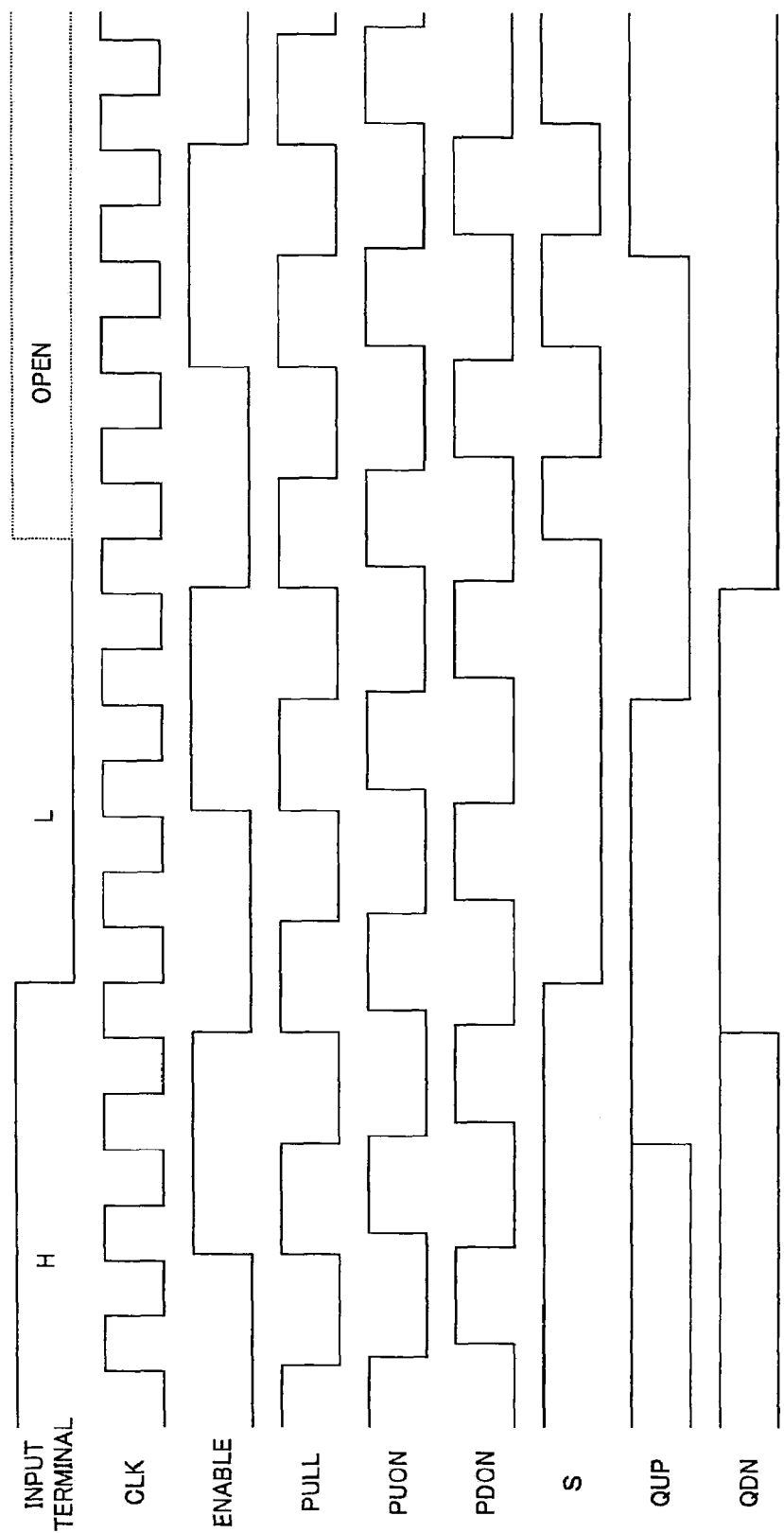
FIG. 2 is a timing chart showing the operation of the ternary value input circuit in an embodiment of the present invention.

An operation of the ternary value input circuit 100 configured in this manner will be described with reference to the timing chart of FIG. 2. Hereinafter, the operation will be described when high level and low level signals are input by the input terminal IN and when the input terminal IN is open. The high level of the input terminal IN is set higher than the upper threshold voltage of the Schmitt trigger buffer 24 and the low level of the input terminal IN is set lower than the lower threshold voltage of the Schmitt trigger buffer 24. Furthermore, the supply voltage VDD applied to the drain of the pull-up transistor 20 is a voltage greater than or equal to the high level for the logic circuits and the supply voltage VSS applied to the pull-down transistor 22 is a voltage less than or equal to the low level for the logic circuits.

The system clock signal CLK is a pulse signal having a predetermined frequency. Here, the enable signal is a pulse signal having four times the period of the system clock signal and the pull signal is a pulse signal having double the period of the system clock signal.

When the pull signal input by the pull signal generator circuit 26 becomes a high level, the output PDON of the AND gate 26d becomes a low level at a slightly delayed timing, and the output PUON of the NOT gate 26e becomes a high level at a slightly further delayed timing. Furthermore, when the pull signal input by the pull signal generator circuit 26 becomes a low level, the output PUON of the NOT gate 26e becomes a low level at a slightly delayed timing, and the output PDON of the AND gate 26d becomes a high level at a slightly further delayed timing. When the output PUON becomes a high level, the pull-up transistor 20 turns on, and when the output PDON becomes a high level, the pull-down transistor 22 turns on.

The pull signal generator circuit 26 varies the outputs PUON and PDON so that the timing of the changes do not coincide. This prevents the pull-up transistor 20 and the pull-down transistor 22 from switching simultaneously and causing the input of the Schmitt trigger buffer 24 to become unstable.

When the input terminal IN is a high level, the pull-up transistor 20 turns on or the pull-down transistor 22 turns on so that in any event the input of the Schmitt trigger buffer 24 is a high level and a high level is output from the Schmitt trigger buffer 24.

The pull-up output circuit 28 holds the output QUP at a high level at the rising edge of the system clock signal CLK when the output of the Schmitt trigger buffer 24, the enable signal, and the output PUON are high levels. On the other hand, the pull-down output circuit 30 holds the output QDN at a high level at the rising edge of the system clock CLK when the output of the Schmitt trigger buffer 24, the enable signal, and the output PDON are high levels.

In this manner, when the input terminal IN is a high level, both outputs QUP and QDN become high levels.

Next, when the input terminal IN is a low level, the pull-up transistor 20 turns on or the pull-down transistor 22 turns on so that in any event the input of the Schmitt trigger buffer 24 is a low level and a low level is output from the Schmitt trigger buffer 24.

The pull-up output circuit 28 holds the output QUP at a low level at a rising edge of the system clock signal CLK when the output of the Schmitt trigger buffer 24 is a low level and the enable signal and the output PUON are high levels. On the other hand, the pull-down output circuit 30 holds the output QDN at a low level at a rising edge of the system clock CLK when the output of the Schmitt trigger buffer 24 is a low level and the enable signal and the output PDON are high levels.

In this manner, when the input terminal IN is a low level, both outputs QUP and QDN become low levels.

Next, when the input terminal IN is open and when the pull-up transistor 20 is on, the input of the Schmitt trigger buffer 24 becomes a high level and a high level is output from the Schmitt trigger buffer 24. When the pull-down transistor 22 is on, the input of the Schmitt trigger buffer 24 becomes a low level and a low level is output from the Schmitt trigger buffer 24.

The pull-up output circuit 28 holds the output QUP at a high level at a rising edge of the system clock CLK when the output of the Schmitt trigger buffer 24 is a high level and the enable signal and the output PUON are high levels. On the other hand, the pull-down output circuit 30 holds the output QDN at a low level at a rising edge of the system clock CLK when the output of the Schmitt trigger buffer 24 is a low level and the enable signal and the output PDON are high levels.

In this manner, when the input terminal IN is open, the output QUP becomes a high level and the output QDN becomes a low level.

Thus, the ternary value input circuit 100 in the embodiment varies the combination of the output QUP and the output QDN in accordance with the three states of the input terminal IN of high level, low level, and open. Namely, (1) the input terminal IN can be indicated as a high level when the output QUP and the output QDN are both high levels, (2) the input terminal IN can be indicated as a low level when the output QUP and the output QDN are both low levels, and (3) the input terminal IN can be indicated as open when the output QUP is a high level and the output QDN is a low level.

Figure 3:
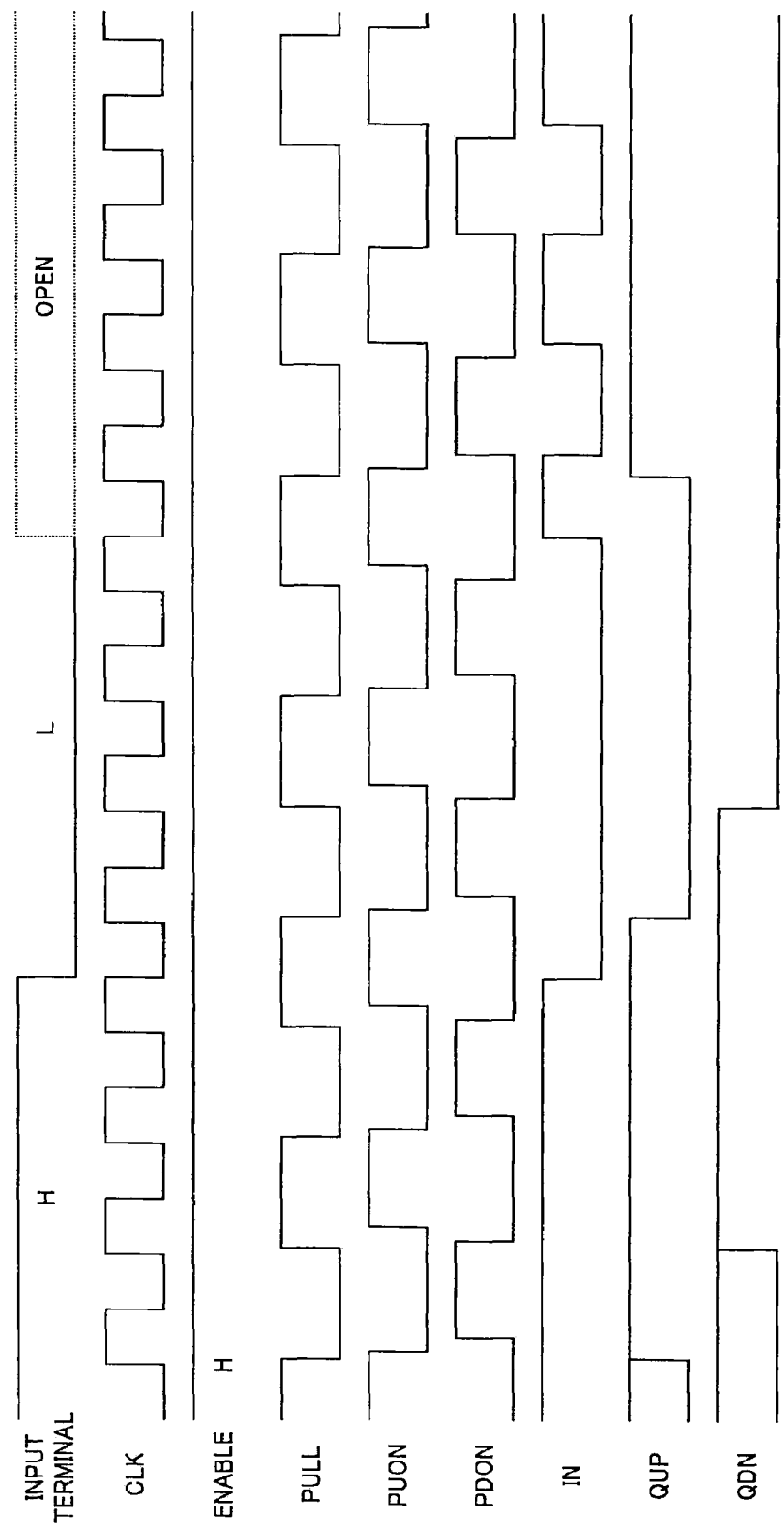
FIG. 3 is a timing chart showing the operation of the ternary value input circuit in an embodiment of the present invention.

With the enable signal ENABLE always at a high level in the ternary value input circuit 100, the output QUP and the output QDN according to the three states of the input terminal IN can be obtained as shown in FIG. 3.

Furthermore, transistors 34a and 34b for ESD protection may be provided for absorbing sudden changes in the signal input from the input terminal IN.

Modified Example 1

Figure 4:
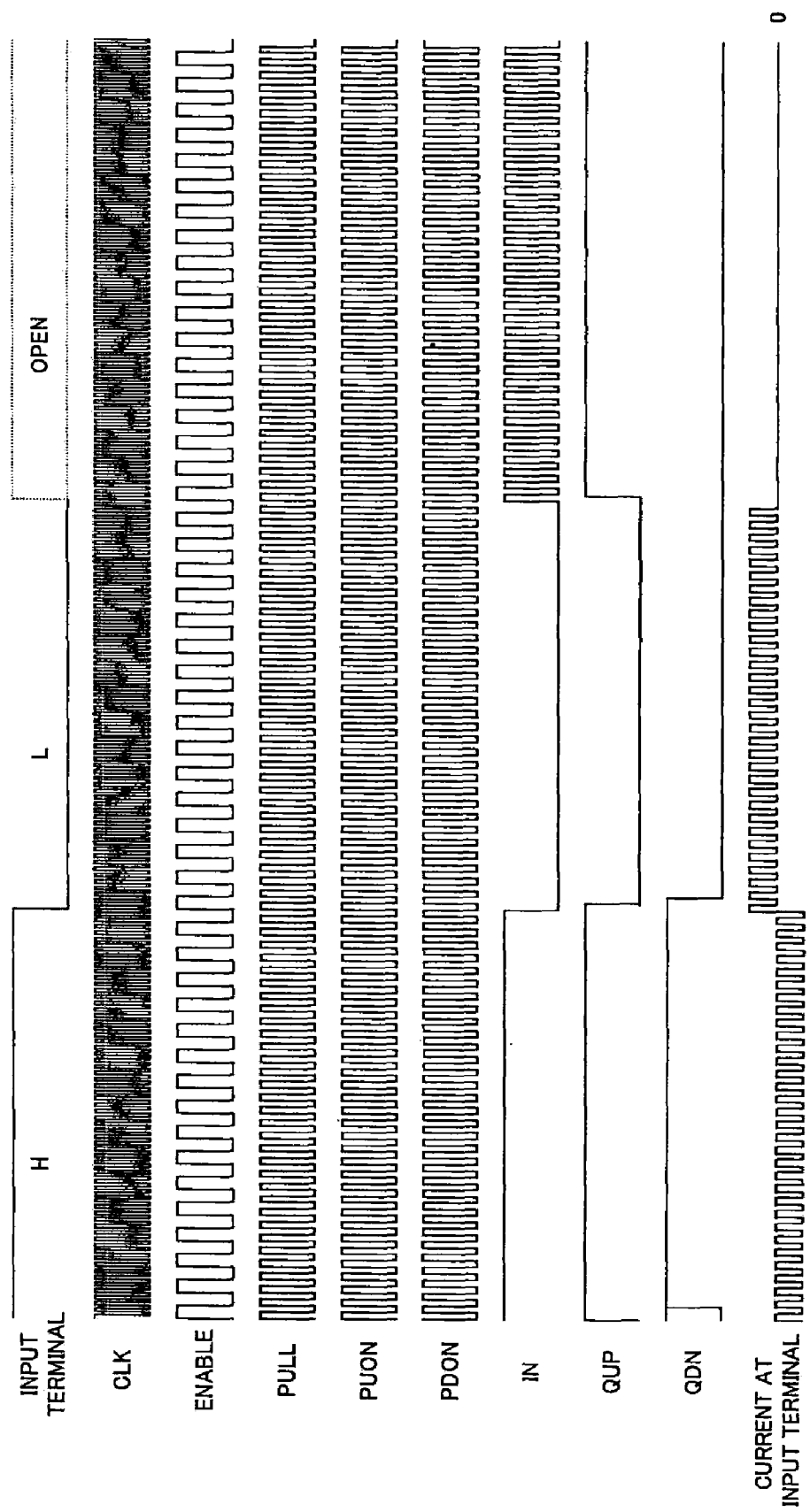
FIG. 4 is a timing chart showing current of an input terminal of ternary value input circuit in an embodiment of the present invention.

In the configuration of the ternary value input circuit 100 in the above-mentioned embodiment, frequent switching of pull-up and pull-down causes current to flow via the pull-up transistor 20 or the pull-down transistor 22 as shown by the current at the input terminal in FIG. 4 and increases the power consumption of the circuit.

Figure 5:
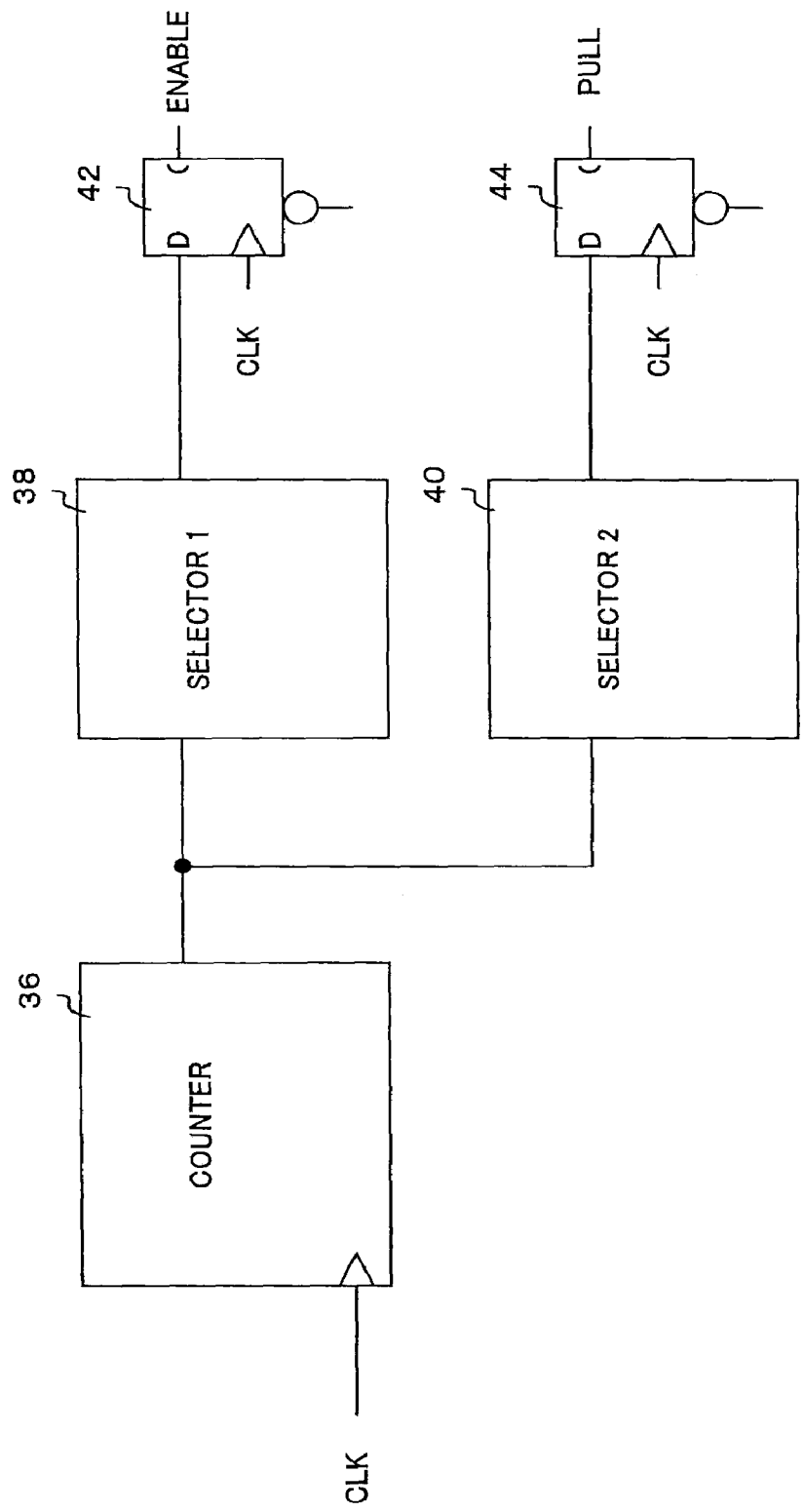
FIG. 5 shows a configuration of a signal generator circuit in a modified example 1 of the present invention.

Consequently, it is preferable to generate the enable signal ENABLE and the pull signal PULL with a signal generator circuit 200 shown in FIG. 5.

The signal generator circuit 200 includes a counter 36, a first selector 38, a second selector 40, and flip-flops 42 and 44. The counter 36 receives the system clock CLK, cyclically counts from 0 to a predetermined value, and outputs the counter value. In the embodiment, the counter 36 counts up from 0 to 63, returns the counter value from 63 to 0, and repeats the count up. The first selector 38 receives the counter value output from the counter 36 and outputs a high level (H) when the counter value is a first value or the first value plus 1 and outputs a low level (L) when the counter value is any other value. For example, a high level (H) is output when the counter value is 62 or 63 and a low level (L) is output when the counter value is any other value. The second selector 40 receives the counter value output from the counter 36 and outputs a low level (L) when the counter value is the first value plus 1 and outputs a high level (H) when the counter value is any other value. For example, in the embodiment, a low level (L) is output when the counter value is 63 and a high level (H) is output when the counter value is any other value. The flip-flop 42 receives the output from the first selector 38 and latches and outputs the output state from the first selector 38 at the timing of the input system clock CLK. The flip-flop 44 receives the output from the second selector 40 and latches and outputs the output state from the second selector 40 at the timing of the input system clock CLK.

Figure 6:
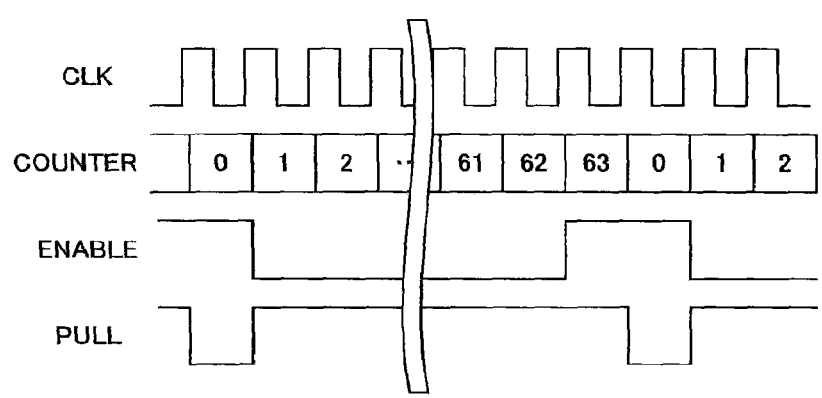
FIG. 6 is a timing chart showing the operation of the signal generator circuit in modified example 1 of the present invention.

FIG. 6 shows a timing chart of the enable signal and the pull signal generated by the signal generator circuit 200. As shown in FIG. 6, the first selector 38 becomes a high level when the counter value is 62 or 63 and the first selector 38 becomes a low level when the counter value returns to 0. In conjunction a pulse signal is output where the output of the flip-flop 42 becomes a high level when the counter value reaches 62 and the clock signal changes from a low level to a high level and returns to a low level when the counter value changes to 0 and the clock signal changes from a low level to a high level. Furthermore, when the counter value is 63, the second selector 40 becomes a low level and when the counter value returns to 0, the second selector 40 becomes a low level. In conjunction a pulse signal is output where the output of the flip-flop 44 becomes a low level when the counter value reaches 63 and the clock signal changes from a low level to a high level and returns to a high level when the counter value changes to 0 and the clock signal changes from a low level to a high level.

Figure 7:
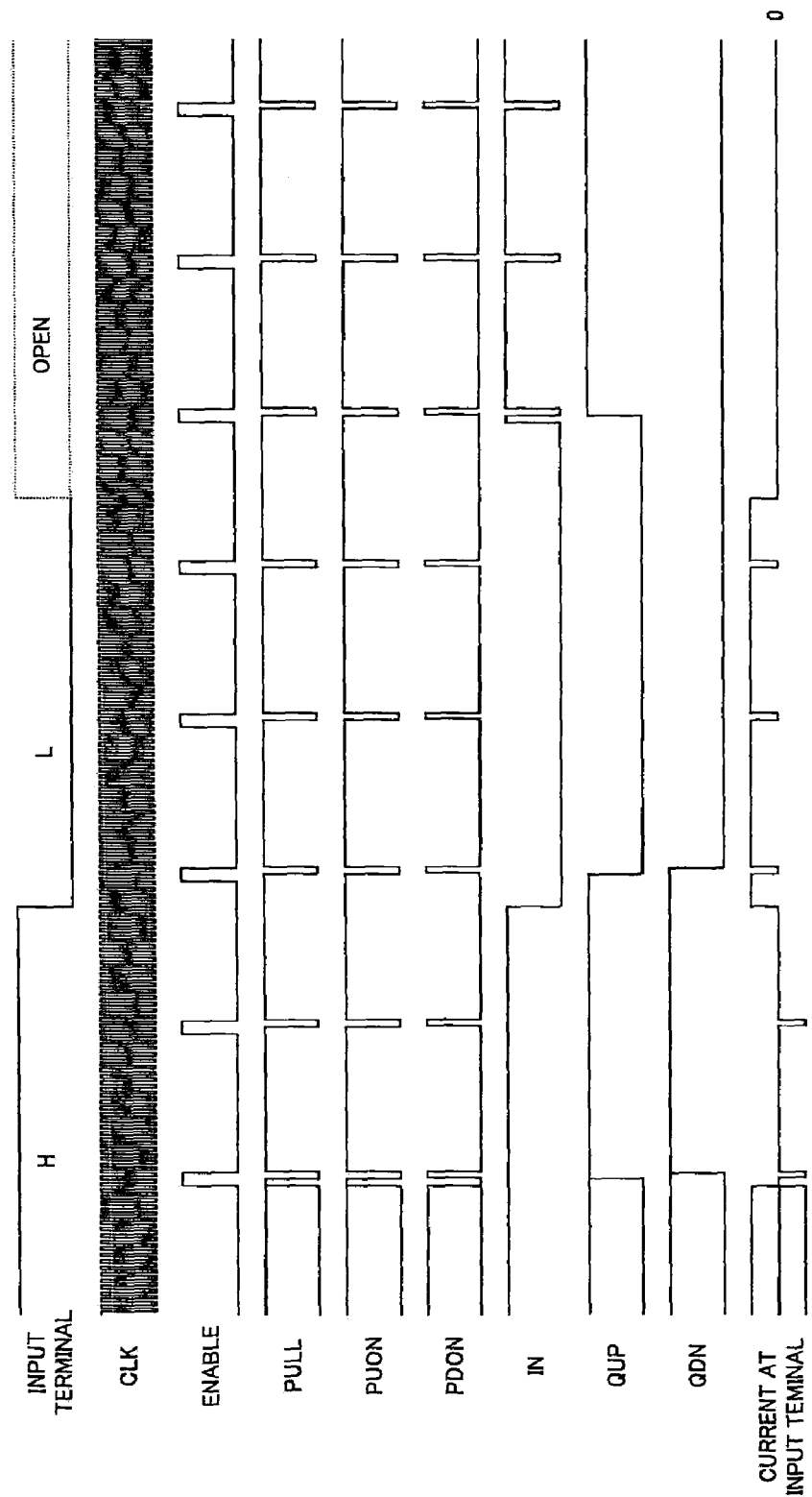
FIG. 7 is a timing chart showing the operation of the ternary value input circuit in modified example 1 of the present invention.

By having the ternary value input circuit 100 input the ENABLE signal and the PULL signal generated by the signal generator circuit 200, the outputs shown in the timing chart of FIG. 7 can be obtained. Namely, (1) outputs QUP and QDN are both high levels when the input terminal IN is a high level, (2) outputs QUP and QDN are both low levels when the input terminal IN is a low level, and (3) the output QUP is a high level and the output QDN is a low level when the input terminal IN is open.

Furthermore, in the case where the input terminal IN is a high level, current flows to the input terminal IN only when the pull-down transistor 22 is on so that the current flowing at the input terminal IN is less than the case shown in FIG. 4.

Modified Example 2

Figure 8:
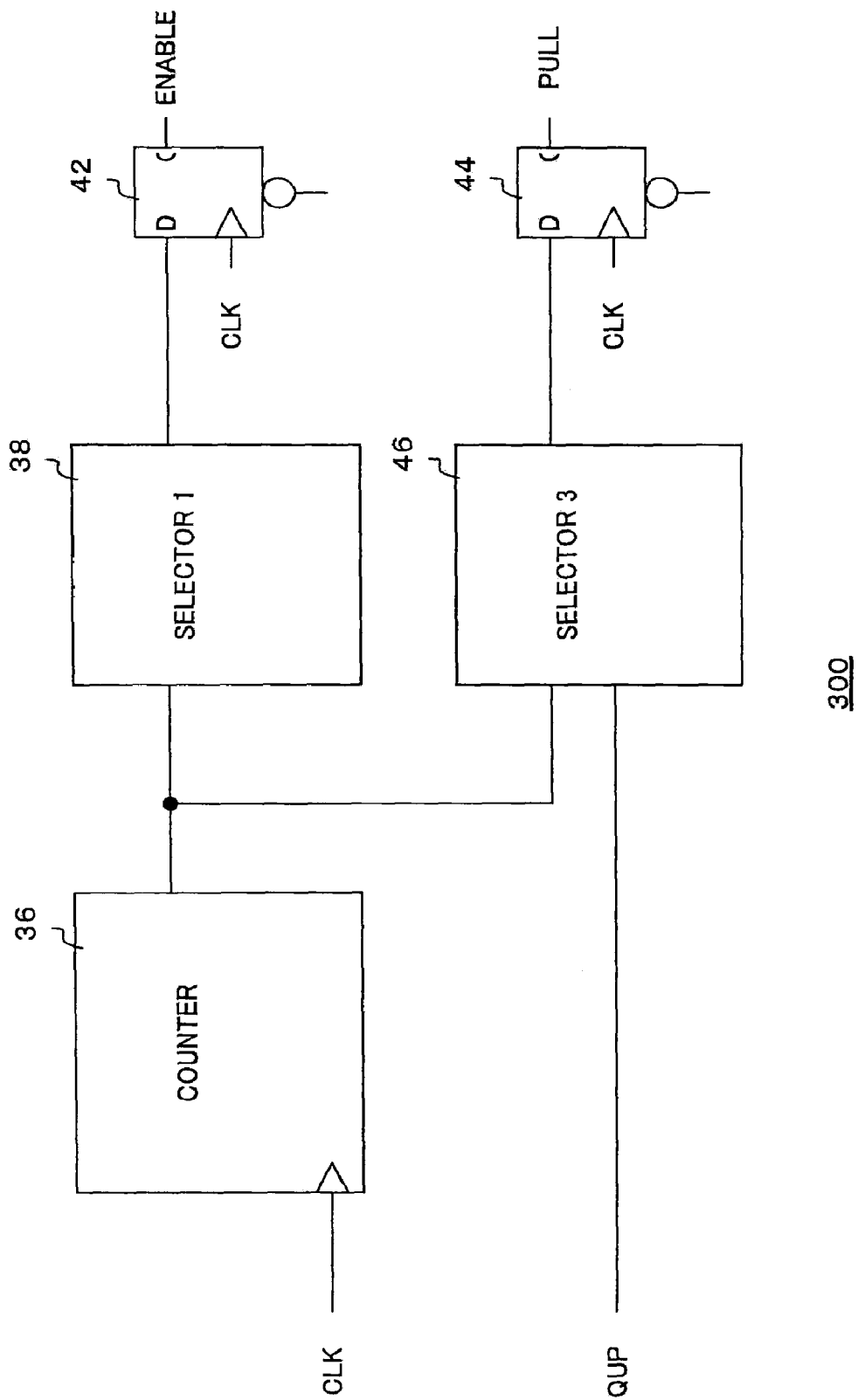
FIG. 8 shows a configuration of the signal generator circuit in a modified example 2 of the present invention.

It is preferable to generate the enable signal ENABLE and the pull signal PULL with a signal generator circuit 300 shown in FIG. 8.

The signal generator circuit 300 includes the counter 36, the first selector 38, the flip-flops 42 and 44, and a third selector 46. Since the signal generator circuit 300 is identical to the signal generator circuit 200 except for the third selector 46, mainly the operation of the third selector 46 will be described hereinafter.

The third selector 46 receives the counter value output from the counter 36, the output signal QUP of the pull-up output circuit 28, and a feedback signal of the output PULL of the flip-flop 42, and outputs the output signal QUP when the value of the counter is the first value plus 2, outputs a low level when the value of the counter is the first value plus 1, and outputs the feedback signal otherwise.

For example, when the first value is 62, a low level (L) is output when the counter value is 63, which is the first value plus 1. Furthermore, when the counter value is 0, which is the first value plus 2 (cyclically counted from 63 to 0), a high level (H) is output if the output signal QUP is a high level (H) and a low level (L) is output if the output signal QUP is a low level (L). When the counter value is other than 0 or 63, the feedback signal is output.

Figure 9:
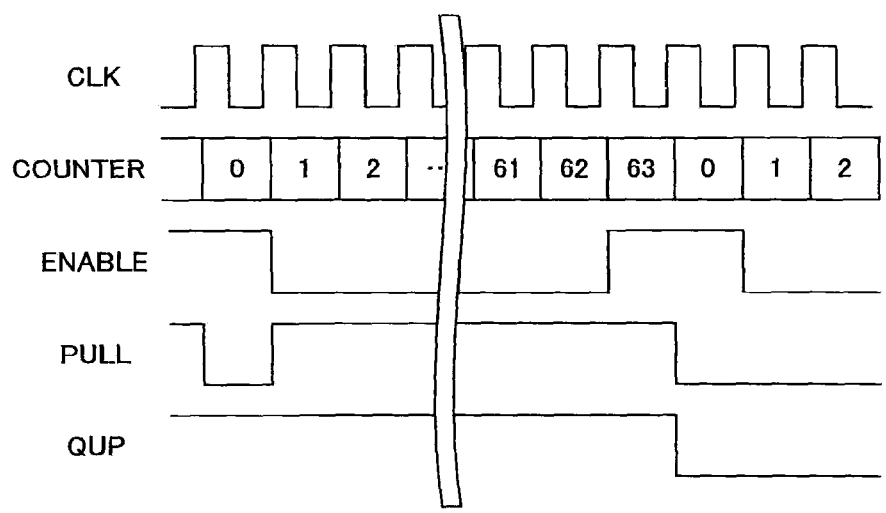
FIG. 9 is a timing chart showing the operation of the signal generator circuit in modified example 2 of the present invention.

FIG. 9 shows a timing chart of the enable signal and the pull signal generated by the signal generator circuit 300. As shown in FIG. 9, the first selector 38 becomes a high level when the counter value is 62 or 63 and the first selector 38 becomes a low level when the counter value returns to 0. In conjunction a pulse signal is output where the output of the flip-flop 42 becomes a high level when the counter value becomes 62 and returns to a low level when the counter value becomes 0.

Furthermore, in the case where the output signal QUP is a high level, the third selector 46 becomes a low level when the counter value is 63 and the third selector 46 becomes a high level when the counter value returns to 0. In conjunction the output of the flip-flop 44 becomes a low level when the counter value becomes 63 and the clock signal changes from a low level to a high level, and latches to a high level when the counter value becomes 0 and the clock signal changes from a low level to a high level. Thereafter, until the counter value again becomes 63 and the clock signal changes from a low level to a high level, the third selector 46 continues to output the PULL signal, which has been latched to a high level by the flip-flop 44, and as a result the flip-flop 44 also continues to be latched to a high level.

On the other hand, in the case where the output signal QUP is a low level, the third selector 46 becomes a low level when the counter value is 63 and the third selector 46 maintains the low level also when the counter value returns to 0. In conjunction the output of the flip-flop 44 is latched to a low level when the counter value is 0 or 63 and the clock signal changes from a low level to a high level. Thereafter, until the counter value again becomes 63 and the clock signal changes from a low level to a high level, the third selector 46 continues to output the PULL signal, which has been latched to a low level by the flip-flop 44, and as a result the flip-flop 44 also continues to be latched to a low level.

Figure 10:
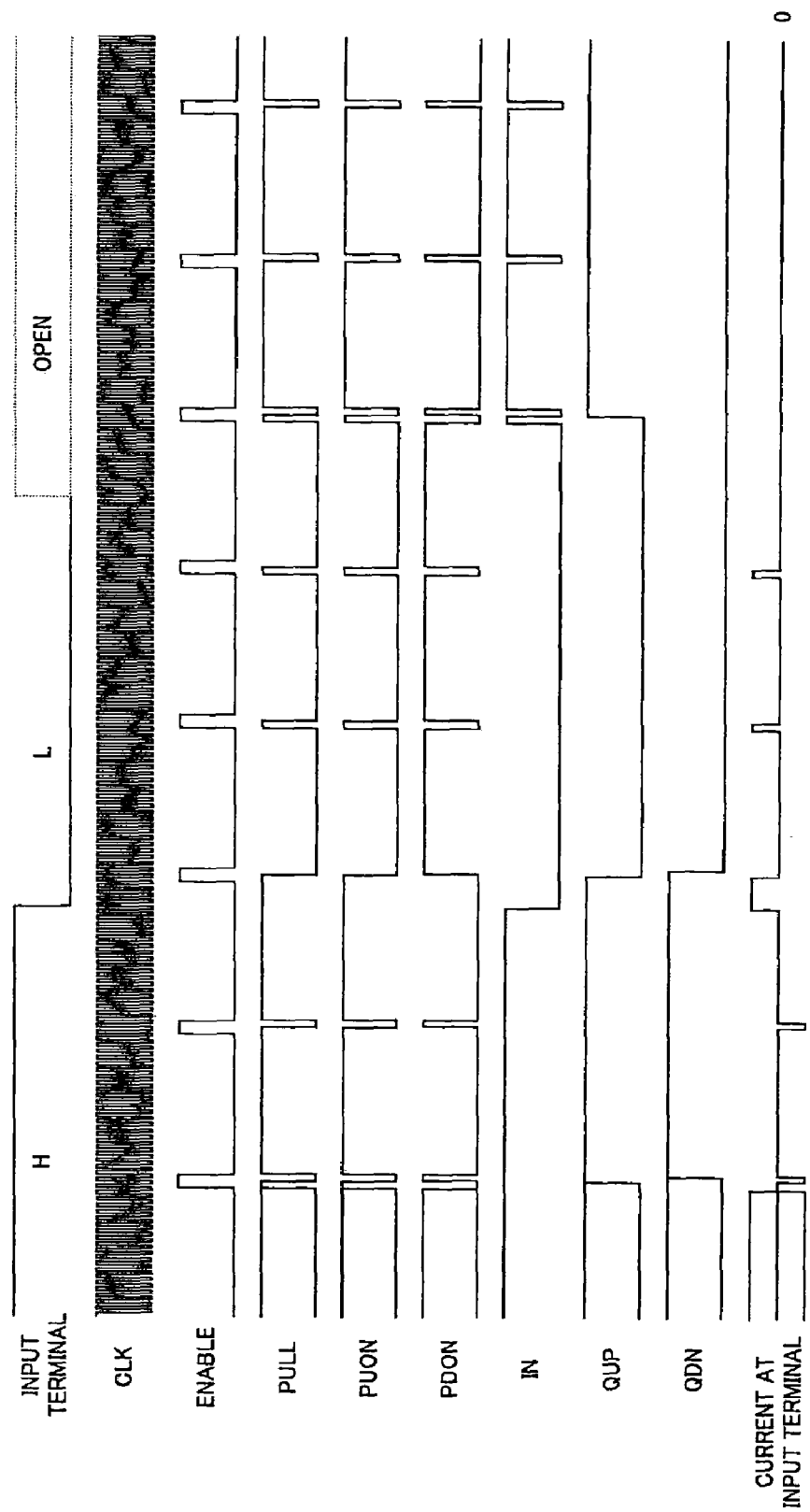
FIG. 10 is a timing chart showing the operation of the ternary value input circuit in modified example 2 of the present invention.
Figure 11:
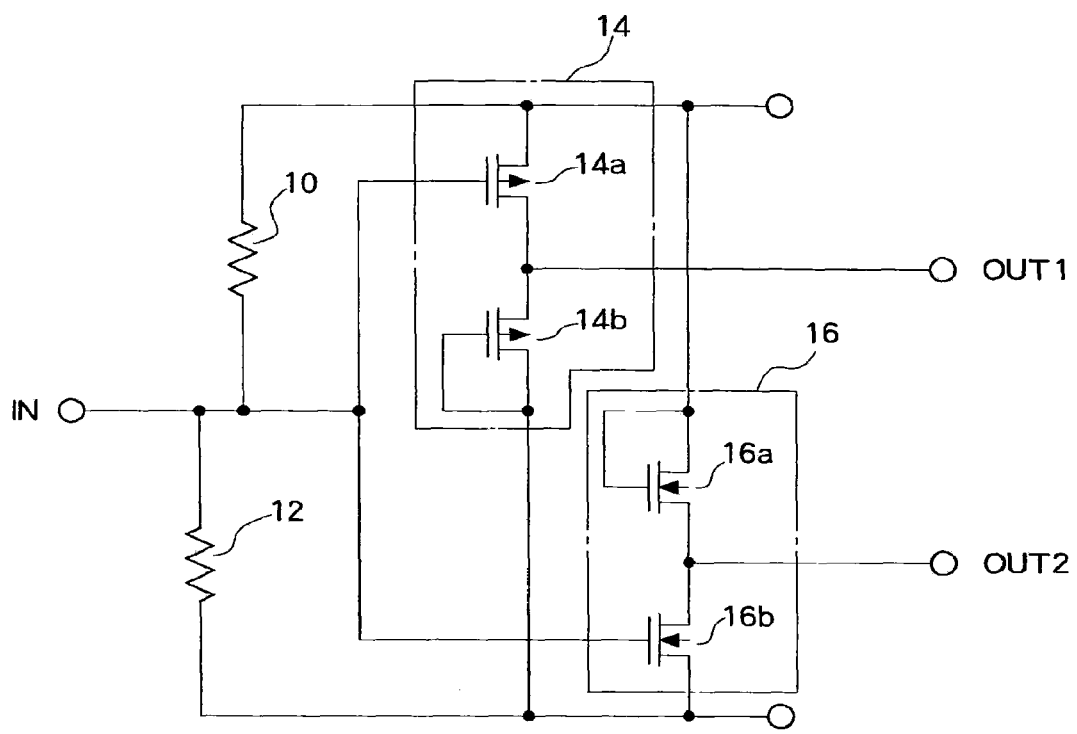
FIG. 11 shows a configuration of the ternary value input circuit in the related art.

By having the ternary value input circuit 100 input the ENABLE signal and the PULL signal generated by the signal generator circuit 300, the outputs shown in the timing chart of FIG. 10 can be obtained. Namely, (1) outputs QUP and QDN are both high levels when the input terminal IN is a high level, (2) outputs QUP and QDN are both low levels when the input terminal IN is a low level, and (3) the output QUP becomes a high level and the output QDN becomes a low level when the input terminal IN is open.

Furthermore, in the case where the input terminal IN is a high level, current flows to the input terminal IN only when the pull-down transistor 22 is on so that the current flowing at the input terminal IN is less than the case shown in FIG. 4. Moreover, in the case where the input terminal IN is a low level, current flows to the input terminal IN only when the pull-up transistor 20 is on so that the current flowing at the input terminal IN is less than the case shown in FIG. 4.

While there has been described what are at present considered to be preferred embodiments of the invention, it will be understood that various modifications may be made thereto, and it is intended that the appended claims cover all such modifications as fall within the true spirit and scope of the invention.

What is claimed is:

1. A ternary value input circuit for converting and outputting three states of an input terminal into a combination of states of two output terminals, comprising:
   a pull-up switching device for controlling connection and non-connection of said input terminal and a first power supply;
   a pull-down switching device for controlling connection and non-connection of said input terminal and a second power supply; and
   a pull signal generator circuit for generating a pull-up control signal for on and off control of said pull-up switching device and a pull-down control signal for on and off control of said pull-down switching device;
   wherein said pull-up switching device and said pull-down switching device are operated exclusively on and off in time division to hold and output the state of said input terminal during each operating state from said two output terminals; and
   wherein the pull signal generator circuit comprises:
      a first NOT gate having an input terminal and an output terminal;
      a buffer having an input terminal and an output terminal;
      an OR gate having a first and second input terminals and an output terminal;
      an AND gate having a first and second input terminals and an output terminal; and
      a second NOT gate having an input terminal and an output terminal;
      wherein the output terminal of the first NOT gate is connected to the input terminal of the buffer, the first input terminal of the OR gate, and the first input terminal of the AND gate;
      the output terminal of the buffer is connected to the second input terminal of the OR gate and the second input terminal of the AND gate; and
      the output terminal of the OR gate is connected to the output terminal of the NOT gate.

2. A ternary value input circuit according to claim 1, comprising:
   a pull-up output circuit for latching the state of said input terminal when said pull-up switching device is on and outputting from one of said two output terminals; and
   a pull-down output circuit for latching the state of said input terminal when said pull-down switching device is on and outputting from the other of said two output terminals.

3. A ternary value input circuit according to claim 1, wherein:
   said pull signal generator circuit generates said pull-up control signal having a longer off period, which turns off said pull-up switching device, than an on period, which turns on said pull-up switching device.

4. A ternary value input circuit according to claim 1, wherein:
   said pull signal generator circuit generates said pull-down control signal having a longer off period, which turns off said pull-down switching device, than an on period, which turns on said pull-down switching device.

5. A ternary value input circuit for converting and outputting three states of an input terminal into a combination of states of two output terminals, comprising:
   a pull-up switching device for controlling connection and non-connection of said input terminal and a first power supply;
   a pull-down switching device for controlling connection and non-connection of said input terminal and a second power supply; and
   a pull signal generator circuit for generating a pull-up control signal for on and off control of said pull-up switching device and a pull-down control signal for on and off control of said pull-down switching device;
   a pull-up output circuit for latching the state of said input terminal when said pull-up switching device is on and an enable signal indicates an enable state, and outputting from one of said two output terminals; and
   a pull-down output circuit for latching the state of said input terminal when said pull-down switching device is on and an enable signal indicates an enable state, and outputting from the other of said two output terminals;
   wherein said pull-up switching device and said pull-down switching device are operated exclusively on and off in time division to hold and output the state of said input terminal during each operating state from said two output terminals
   wherein the pull-up output circuit comprises:
      a first AND gate having first and second input terminals and an output terminal;
      a NOT gate having an input terminal and an output terminal;
      a second AND gate having first and second input terminals and an output terminal;
      a third AND gate having first and second input terminals and an output terminal;
      an OR gate having first and second input terminals and an output terminal;
      and a flip-flop having an input terminal and an output terminal;
      wherein the enable signal is input into the first input terminal of the first AND gate;
      a pull-up signal is input into the second input terminal of the first AND gate;
      the output terminal of the first AND gate is connected to the input terminal of the NOT gate and the first input terminal of the third AND gate;
      the output of a Schmitt trigger buffer is input into the second input terminal of the third AND gate;

the output terminal of the flip-flop is connected to the first input terminal of the second AND gate;

the output of the NOT gate is connected to the second input terminal of the second AND gate;

the output terminal of the second AND gate is connected to the first input terminal of the OR gate and the output terminal of the third AND gate is connected to the second input terminal of the OR gate; and the output terminal of the OR gate is connected to the input terminal of the flip-flop.

6. A ternary value input circuit for converting and outputting three states of an input terminal into a combination of states of two output terminals, comprising:

a pull-up switching device for controlling connection and non-connection of said input terminal and a first power supply;

a pull-down switching device for controlling connection and non-connection of said input terminal and a second power supply; and a pull signal generator circuit for generating a pull-up control signal for on and off control of said pull-up switching device and a pull-down control signal for on and off control of said pull-down switching device;

a pull-up output circuit for latching the state of said input terminal when said pull-up switching device is on and an enable signal indicates an enable state, and outputting from one of said two output terminals; and a pull-down output circuit for latching the state of said input terminal when said pull-down switching device is on and an enable signal indicates an enable state, and outputting from the other of said two output terminals;

wherein said pull-up switching device and said pull-down switching device are operated exclusively on and off in time division to hold and output the state of said input terminal during each operating state from said two output terminals wherein the pull-down output circuit comprises:

a first AND gate having first and second input terminals and an output terminal;

a NOT gate having an input terminal and an output terminal;

a second AND gate having first and second input terminals and an output terminal;

a third AND gate having first and second input terminals and an output terminal;

an OR gate having first and second input terminals and an output terminal;

and a flip-flop having an input terminal and an output terminal;

wherein the enable signal is input into the first input terminal of the first AND gate;

a pull-down signal is input into the second input terminal of the first AND gate;

the output terminal of the first AND gate is connected to the input terminal of the NOT gate and the second input terminal of the third AND gate;

the output of a Schmitt trigger buffer is input into the first input terminal of the third AND gate;

the output terminal of the flip-flop is connected to the first input terminal of the second AND gate;

the output of the NOT gate is connected to the second input terminal of the second AND gate;

the output terminal of the second AND gate is connected to the first input terminal of the OR gate and the output terminal of the third AND gate is connected to the second input terminal of the OR gate; and the output terminal of the OR gate is connected to the input terminal of the flip-flop.

\* \* \* \* \*